US008406040B2

(12) United States Patent
Worledge et al.

(10) Patent No.: US 8,406,040 B2
(45) Date of Patent: Mar. 26, 2013

(54) SPIN-TORQUE BASED MEMORY DEVICE USING A MAGNESIUM OXIDE TUNNEL BARRIER

(75) Inventors: Daniel C. Worledge, Yorktown Heights, NY (US); Guohan Hu, Yorktown Heights, NY (US); Jonathan Z. Sun, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 308 days.

(21) Appl. No.: 12/684,530

(22) Filed: Jan. 8, 2010

(65) Prior Publication Data

US 2011/0171493 A1 Jul. 14, 2011

(51) Int. Cl.
*H01F 10/08* (2006.01)
*H01L 43/08* (2006.01)
*G11B 5/39* (2006.01)

(52) U.S. Cl. ..................... 365/158; 365/171; 428/811.1; 428/811.2; 428/811.5

(58) Field of Classification Search ........................ None
See application file for complete search history.

(56) References Cited

U.S. PATENT DOCUMENTS 6,480,365 B1 11/2002 Gill et al.
6,593,608 B1 7/2003 Sharma et al.
6,784,509 B2 * 8/2004 Yuasa et al. ................... 257/421
7,009,903 B2 3/2006 Perner et al.
7,268,982 B2 * 9/2007 Gill .......................... 360/324.11
7,268,986 B2 9/2007 Gill
7,488,609 B1 2/2009 Lin et al.
7,583,481 B2 * 9/2009 Zhang et al. ............. 360/324.11
7,897,274 B2 * 3/2011 Yuasa et al. ................ 428/811.3
2004/0061983 A1 * 4/2004 Childress et al. .......... 360/324.2
2007/0086121 A1 4/2007 Nagase et al.
2008/0179699 A1 7/2008 Horng et al.
2008/0231998 A1 * 9/2008 Yoshikawa et al. ........... 360/313
2009/0108383 A1 4/2009 Horng et al.
2009/0122450 A1 * 5/2009 Wang et al. ................ 360/324.2
2010/0177449 A1 * 7/2010 Zhao et al. ............... 360/324.12
2010/0316890 A1 * 12/2010 Choi et al. ................. 428/811.1

OTHER PUBLICATIONS

Chih-Ta Shen et al. “Improvement of Transport Properties in Magnetic Tunneling Junctions by Capping Materials,” IEEE Transactions on Magnetics; Jun. 2007, pp. 2785-2787, vol. 43, No. 6, IEEE.
Masahiko Nakayama et al., “Spin transfer switching in TbCoFe/CoFeB/MgO/CoFeB/TbCoFe magnetic tunnel junctions with perpendicular magnetic anisotropy,” 2008 American Institute of Physics; Journal of Applied Physics 103, 07A710; (2008); pp. 07A710-1-071710-3.
W. J. Gallagher et al., “Development of the magnetic tunnel junction MRAM at IBM: From first junctions to a 16-Mb MRAM demonstrator chip”; IBM J. Res. & Dev. vol. 50 No. 1 Jan. 2006; pp. 1-19.
S. Ikeda et al., “Tunnel magnetoresistance of 604% at 300 K by suppression of Ta diffusion in CoFeB/MgO/CoFeB pseudo-spin-valves annealed at high temperature”; Applied Physics Letters 93, 082508 (2008) pp. 1-3.
Lizian Jiang et al., “Large Tunnel Magnetoresistance of 1056% at Room Temperature in MgO Based Double Barrier Magnetic Tunnel Junction”; Applied Physics Express 2 (2009) 083002; pp. 1-3.
T. Maruyama et al., “Large voltage-induced magnetic anisotropy change in a few atomic layers of iron”, Letters Published Online: Jan. 18, 2009/ DOI: 10.1038/NNANO.2008.406; pp. 158-161.

* cited by examiner

*Primary Examiner* — Kevin Bernatz
(74) *Attorney, Agent, or Firm* — Cantor Colburn LLP; Vazken Alexanian

(57) ABSTRACT

A magnetic tunnel junction stack including a pinned magnetic layer, a tunnel barrier layer formed of magnesium oxide (MgO), a free magnetic layer adjacent to the tunnel barrier layer, and a layer of vanadium (V) adjacent to the free magnetic layer.

21 Claims, 3 Drawing Sheets

100
60
40
30
20
10
CURRENT

SPIN-TORQUE BASED MEMORY DEVICE USING A MAGNESIUM OXIDE TUNNEL BARRIER

BACKGROUND

The present invention relates to magnetic random access memory, and more specifically, to materials optimized for spin-torque memory using a magnesium oxide (MgO) tunnel barrier layer.

A spin torque magnetic random access memory (MRAM) device uses a two terminal spin-torque based memory element including a pinned layer, a tunnel barrier layer and a free layer in a magnetic tunnel junction (MTJ) stack. The magnetization of the pinned layer is fixed in a direction such that when current passes through the MTJ tack the free layer becomes either parallel or anti-parallel to the pinned layer. Resistance of the device depends on the relative orientation of the free layer and the pinned layers. Recent developments include the use of MgO based magnetic tunnel junction layers. A major problem with the development of a spin-transfer RAM in using MgO as a tunnel barrier layer within the MTJ stack is the amount of switching voltage required to switch the MTJ layer from a parallel state to an anti-parallel state.

SUMMARY

The present invention provides magnetic tunnel junction (MTJ) stacks of optimal material choices which provides the switching characteristics required for integrated memory applications of a spin-torque switched MTJ device.

According to one embodiment of the present invention, a MTJ stack is provided. The MTJ stack includes a pinned magnetic layer, a tunnel barrier layer formed of magnesium oxide (MgO), a free magnetic layer adjacent to the tunnel barrier layer, and a layer of vanadium (V) adjacent to the free magnetic layer.

According to another embodiment of the present invention, a MTJ stack is provided. The MTJ stack includes a pinned magnetic layer, a tunnel barrier layer formed of magnesium oxide (MgO), and a free magnetic layer adjacent to the tunnel barrier layer, wherein the free magnetic layer includes a plurality of elements wherein at least one element is vanadium.

According to yet another embodiment of the present invention, a magnetic random access memory (MRAM) device is provided. The MRAM device includes a MTJ stack including a pinned magnetic layer, a tunnel barrier layer formed of magnesium oxide (MgO), a free magnetic layer adjacent to the tunnel barrier layer, and a layer of vanadium (V) adjacent to the free magnetic layer.

According to yet another embodiment of the present invention, a MRAM device is provided. The MRAM device includes a MTJ stack including a pinned magnetic layer, a tunnel barrier layer formed of magnesium oxide (MgO), and a free magnetic layer adjacent to the tunnel barrier layer. The free magnetic layer includes a plurality of elements wherein at least one element is vanadium Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
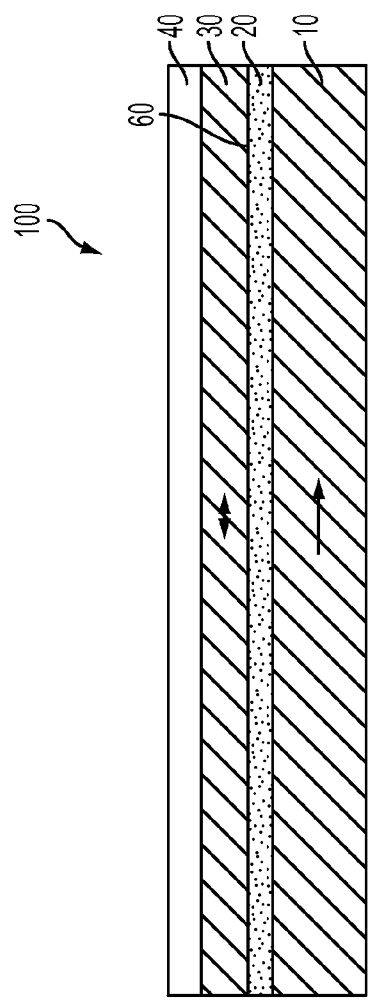
FIG. 1 is a diagram illustrating a magnetic tunnel junction (MTJ) stack that can be implemented within embodiments of the present invention.

With reference now to FIG. 1, a magnetic tunnel junction (MTJ) stack according to an embodiment of the present invention is provided. As shown in FIG. 1, an MJT stack 100 includes a pinned magnetic layer 10, a tunnel barrier layer 20, a free magnetic layer 30 adjacent to the tunnel barrier layer 20, and a capping layer 40. According to an embodiment of the present invention, the pinned magnetic layer 10 is formed of a structure like 150 platinum magnesium (PtMn)|20 cobalt iron (CoFe)|8 ruthenium (Ru)|20CoFe, for example (where the numbers indicate layer thickness in Angstroms). The top layer of the pinned magnetic layer 10 may be formed of at least one of Fe or Co, for example CoFe or CoFeB. According to an embodiment of the present invention, the tunnel barrier layer 20 is formed of magnesium oxide (MgO).

The present invention discloses examples of optimal MTJ stack material choices that provide switching characteristics required for integrated memory applications of a spin-torque switched MTJ. For example, according to one embodiment of the present invention, the free magnetic layer 30 is formed of a layer containing at least one of Fe or Co, for example FeCo or FeCoB.

According to an embodiment of the present invention, the capping layer 40 may be formed of vanadium (V) and is of a predetermined thickness ranging from approximately 10 Angstroms to approximately 100 Angstroms. However, the present invention is not limited hereto, the predetermined thickness may be more than approximately 100 Angstroms. The capping layer 40 of vanadium stabilizes the (bcc) crystallization of the free magnetic layer 30 and provides a low spin-flip-scattering back interface of the free-magnetic layer 30. According to an embodiment of the present invention, the capping layer 40 is used to protect the underlying layers 30, 20, and 10 of the MTJ stack 100 during etching and other processes. The capping layer 40 also acts as an electrical contact to an overlying conductive line (not shown). The capping layer 40 may provide a predetermined amount of strain to the magnetic free layer, partially affecting the free layer's magnetic anisotropy through magnetostriction. The capping layer 40 may further provide unique electronic structures at the interface for the magnetic free layer, affecting the free layer's magnetic anisotropy.

According to yet another embodiment of the present invention, the free magnetic layer 30 may include a plurality of elements wherein at least one element is vanadium. For example, according to one embodiment of the present invention, the free magnetic layer 30 may be formed of a multilayered variation including [xFe|yV|zFe]*n, or [xFeCo|yV|zFeCo]*n or [x FeCoB|y V|z FeCoB]*n, or a combination of the alloys of FeCoV, FeCoVB and V, where x, y and z are predetermined thicknesses and n represents a predetermined number of layers. For example, according to one embodiment of the present invention, x and z may be of a predetermined thickness ranging from approximately 5 to 15 angstroms while y may be of a predetermined thickness ranging from approximately 1 to 10 angstroms. According to the current embodiment of the present invention, the capping layer 40 may be omitted or replaced by a material other than that forming the multilayers within the free layer, such as [xFeCo|yV|zFeCo]*n|100Ta| or other materials.

According to another embodiment, an interface region 60 of the free magnetic layer 30 and the tunnel barrier layer 20 may be formed of an alloy formed of vanadium (V). For example, a FeV alloy may be used, which may be a (bcc) or (bct) structure with a net magnetic moment reduced from the intrinsic moment of Fe or FeCoB. The FeV alloy may be coupled to other ferromagnetic materials that provide high magnetic anisotropy with low magnetic moment such as a Co|Ni multilayered structure with perpendicular magnetic anisotropy.

In FIG. 1, the pinned magnetic layer 10 has a magnetic moment that is fixed in the "x" direction, for example. The free magnetic layer 30 has a magnetic moment that is either parallel or anti-parallel to the magnetic moment of the pinned magnetic layer 10. The tunnel barrier layer 20 is thin enough that a current through it can be established by quantum mechanical tunneling of conduction electrons. The resistance of the tunnel barrier layer 20 changes in response to the relative orientation between the free magnetic layer 30 and the pinned magnetic layer 10. For example, when a current passes down through the MTJ stack 100 in a direction perpendicular to the MTJ stack 100 layers, the free magnetic layer 30 is rotated parallel to the pinned layer 10 (i.e., "1" memory state), resulting in a lower resistance. When a current is passed up through the MTJ stack 100, the free magnetic layer 30 is rotated anti-parallel to the pinned layer 10 (i.e., "0" memory state), resulting in a higher resistance.

Figure 2:
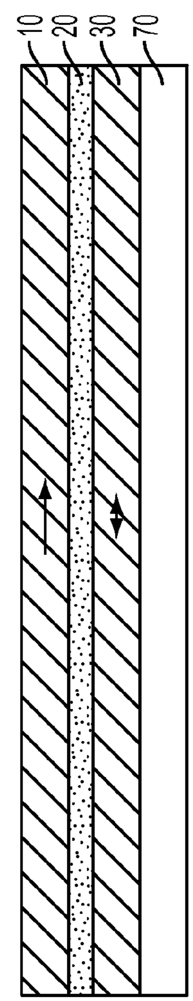
FIG. 2 is a diagram illustrating a MTJ stack that can be implemented within alternative embodiments of the present invention.

The present invention is not limited to a particular arrangement of the MTJ stack as shown in FIG. 1 and may vary accordingly. FIG. 2 is a diagram illustrating an MTJ stack according to an alternative embodiment of the present invention. As shown in FIG. 2, an MTJ stack 200 is grown such that the vanadium (V) acts as a seed layer 70 instead of a capping layer 40, and the free magnetic layer 30 is formed on the seed layer 70. Further, shown in FIG. 2, the tunnel barrier layer 20 is formed overlying the free magnetic layer 30 and the pinned magnetic layer 10 is formed on the tunnel barrier layer 20. For example, according to another embodiment of the present invention, the free magnetic layer 30 may be formed of FeCoV, FeCoVB or FeV where, the free magnetic layer 30 is grown on top of a seed layer formed of silver (Ag) or vanadium (V), or gold (Au) for non-CMOS applications, and the tunnel barrier layer 20 is formed of MgO on top of the free magnetic layer 30 and the pinned layer 10 is formed on the tunnel barrier layer 20.

Comparison data between an MTJ stack of the conventional art and that of the present invention switching from antiparallel to parallel state and vice versa will now be described below with reference to FIGS. 3 and 4.

Figure 3:
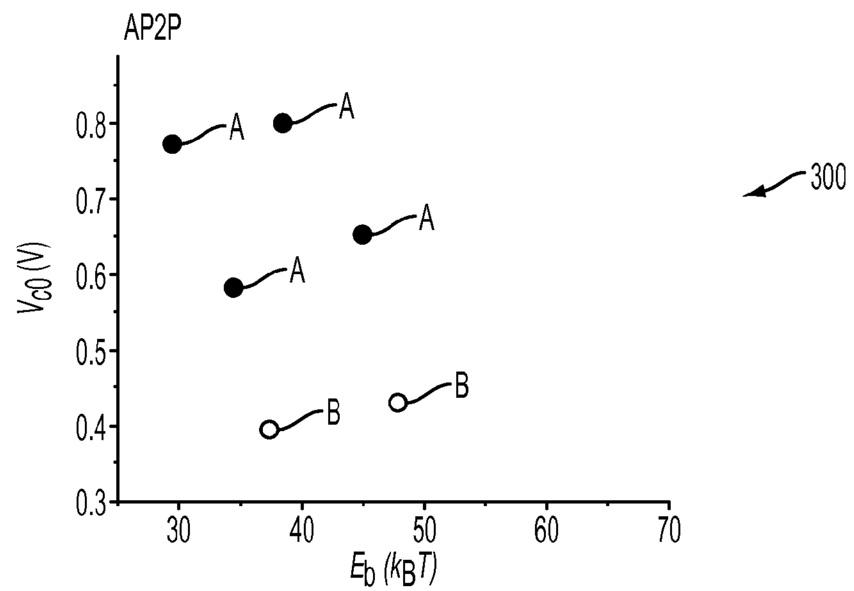
FIG. 3 is a graph illustrating comparison data between a MTJ stack of the conventional art and that of the present invention from an antiparallel state to a parallel state.
Figure 4:
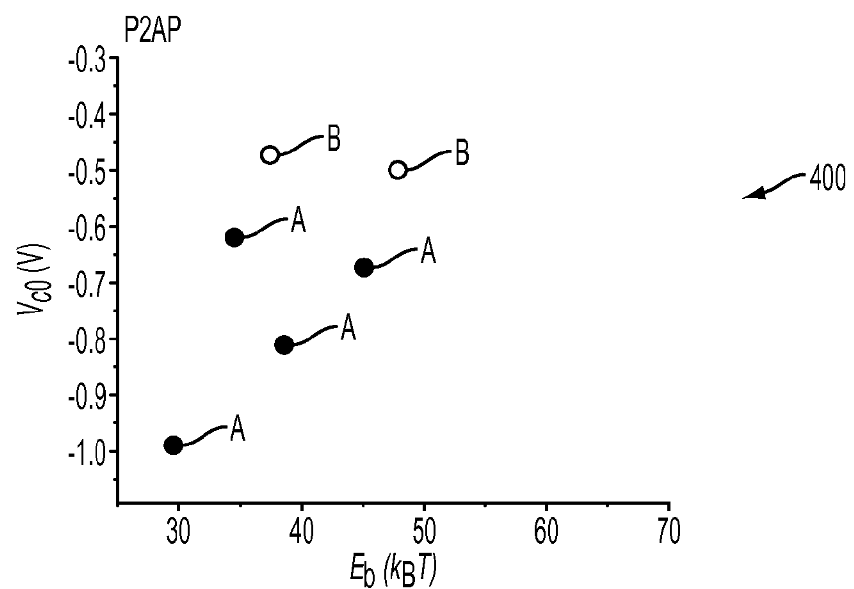
FIG. 4 is a graph illustrating comparison data between a MTJ stack of the conventional art and that of the present invention from a parallel state to an antiparallel state.

FIG. 3 is a graph illustrating comparison data between a MTJ stack of the conventional art and that of the present invention from an antiparallel state to a parallel state (i.e., writing to a "0"). FIG. 4 is a graph illustrating comparison data between a MTJ stack of the conventional art and that of the present invention from a parallel state to an anti-parallel state (writing to a "1"). In the graphs 400 and 500, the x-axis is the energy barrier (i.e., activation energy) which indicates the thermal stability of the bits. This determines a length of time information may be retained. For example, in order for the information to be retained for approximately 10 years, an energy barrier of 40 to 60 kbT is necessary. The y-axis is the switching voltage (Vco) for switching between a parallel state and an antiparallel state of the free layer. Further, the dots A represent a conventional MTJ stack having a capping layer formed of ruthenium (Ru) and the dots B represent an MTJ stack having a capping layer formed of vanadium (V) according to an embodiment of the present invention.

As shown in graph 400, the dots A require the larger voltages (0.6 volts to 0.8 volts) compared to dots B which have lower switching voltage of approximately 0.4 volts. As shown in graph 500, the dots A require the larger voltages −0.6 volts to −0.1 volts compared to dots B which have a lower switching voltage of approximately −0.5 volts.

Figure 5:
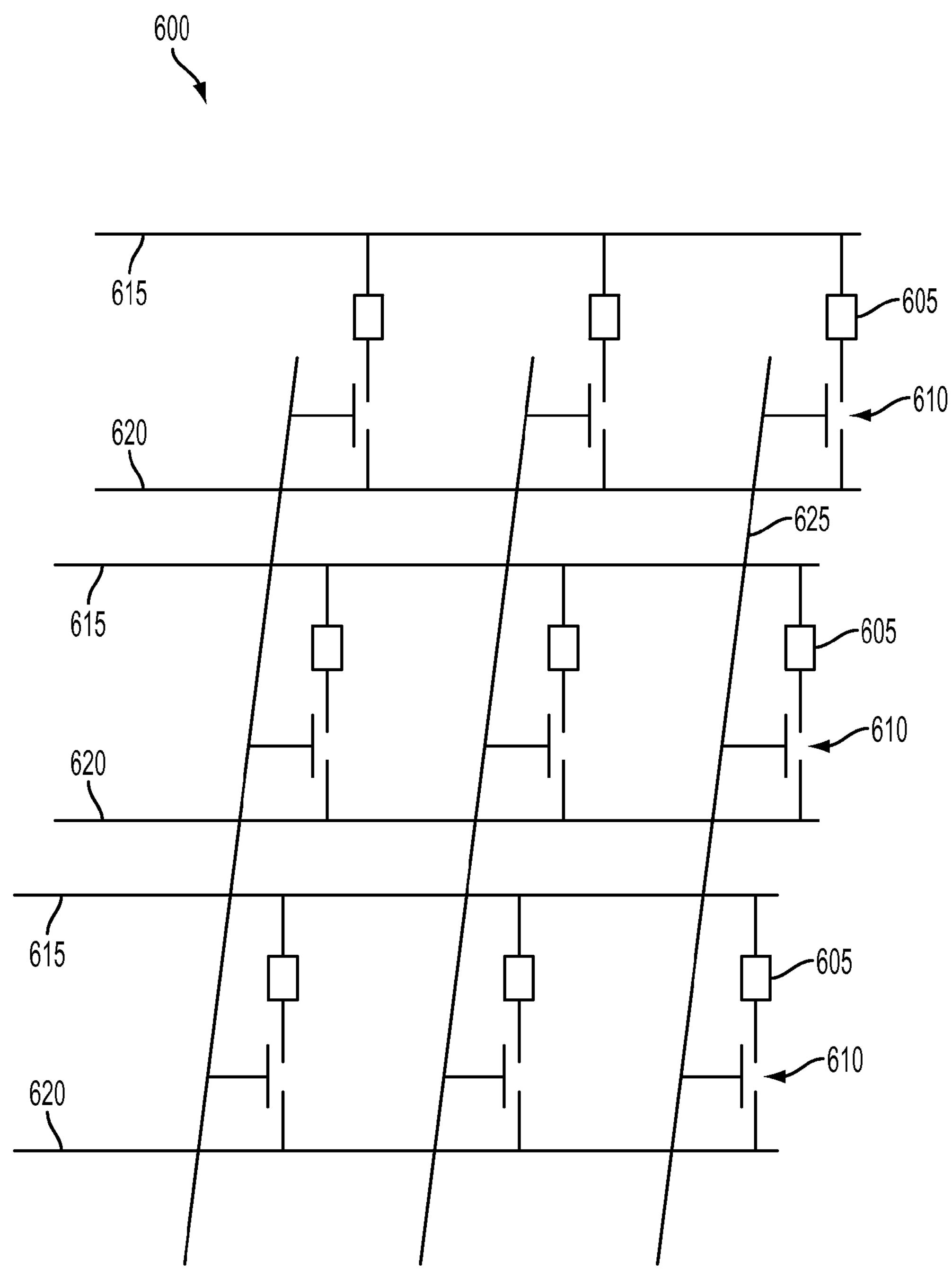
FIG. 5 is a diagram illustrating a spin-torque based magnetic random access memory device having a plurality of MTJ stacks that can be implemented within embodiments of the present invention.

FIG. 5 is a diagram illustrating a spin-torque based magnetic random access memory (MRAM) device having a plurality of MTJ stacks that can be implemented within embodiments of the present invention. As shown in FIG. 5, the spin-torque based MRAM device 600 includes a plurality of MTJ stacks 605. According to an embodiment of the present invention, the MTJ stacks 605 may be the same as MTJ stacks 100 or 200 shown in FIGS. 1 and 2. Each MTJ stack 605 is connected in series to a transistor 610. Each MTJ stack 605 and the transistor 610 are connected together between a bit line 615 and a bit line complement 620. Further, each transistor 610 is connected at a gate thereof to a word line 625. During a write operation, the spin-polarized electrons exert a torque on a free magnetic layer of the MTJ stack 605, which can switch the polarity of the free magnetic layer. During a read operation, a current is used to detect the resistance/logic state of the MTJ stack 605. Each respective transistor 610 is switched on for both read and write operations to allow current to flow through the respective MTJ stack 605, so that the logic state can be read or written.

Embodiments of the present invention use FeB, FeCoV, FeCoBV and the multilayered variations of such to achieve a spin-torque switchable MTJ stack's free magnetic layer. Therefore, the free magnetic layer of the present invention provides combined attributes of (bcc) or (bct) lattice match to the MgO tunnel barrier layer, a low magnetic moment, a low LLG damping coefficient, a low spin-flip scattering rate, and a high amount of interface-mediated perpendicular magnetic anisotropy component.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A magnetic tunnel junction stack comprising:

a pinned magnetic layer;

a tunnel barrier layer formed of magnesium oxide (MgO);

a free magnetic layer adjacent to the tunnel barrier layer; and a layer consisting of vanadium (V) directly adjacent to the free magnetic layer;

wherein the layer of vanadium (V) is of a predetermined thickness of greater than 10 Angstroms and disposed on one of the top or bottom surface of the magnetic tunnel junction stack.

2. The magnetic tunnel junction stack of claim 1, wherein the free magnetic layer includes at least one of iron (Fe) or cobalt (Co).

3. The magnetic tunnel junction stack of claim 1, wherein the free magnetic layer includes a layer of CoFeB.

4. A magnetic tunnel junction stack comprising:

a pinned magnetic layer;

a tunnel barrier layer formed of magnesium oxide (MgO);

a free magnetic layer adjacent to the tunnel barrier layer, wherein the free magnetic layer includes a plurality of elements wherein at least one element is vanadium; and a layer consisting of vanadium (V) directly adjacent to the free magnetic layer;

wherein the layer of vanadium (V) is of a predetermined thickness of greater than 10 Angstroms and disposed on one of the top or bottom surface of the magnetic tunnel junction stack.

5. The magnetic tunnel junction stack of claim 4, wherein the free magnetic layer is formed of a multilayer of iron (Fe), vanadium (V) and cobalt (Co).

6. The magnetic tunnel junction stack of claim 5, wherein the free magnetic layer is formed of multilayer of [x Fe|y V|z Fe] * n, wherein x and z are predetermined thicknesses ranging from approximately 5 to 15 angstroms and y is a predetermined thickness ranging from approximately 1 to 10 angstroms and n represents a predetermined number of layers.

7. The magnetic tunnel junction stack of claim 5, wherein the free magnetic layer is formed of multilayer of [x FeCo|y V|z FeCo] * n, wherein x and z are predetermined thicknesses ranging from approximately 5 to 15 angstroms and y is a predetermined thickness ranging from approximately 1 to 10 angstroms and n represents a predetermined number of layers.

8. The magnetic tunnel junction stack of claim 4, wherein the free magnetic layer is formed of multilayers of iron (Fe), vanadium (V), cobalt (Co) and boron (B) or a combination of alloys thereof.

9. The magnetic tunnel junction stack of claim 8 wherein the free magnetic layer is formed of multilayer of [x FeCoB|y V|z FeCoB] * n, wherein x and z are predetermined thicknesses ranging from approximately 5 to 15 angstroms and y is a predetermined thickness ranging from approximately 1 to 10 angstroms and n represents a predetermined number of layers.

10. The magnetic tunnel junction stack of claim 4, wherein the free magnetic layer is formed on a seed layer comprising one of silver (Ag) or vanadium (V).

11. A magnetic random access memory device comprising:

a magnetic tunnel junction stack including:

a pinned magnetic layer;

a tunnel barrier layer formed of magnesium oxide (MgO);

a free magnetic layer adjacent to the tunnel barrier layer; and a layer consisting of vanadium (V) directly adjacent to the free magnetic layer;

wherein the layer of vanadium (V) is of a predetermined thickness of greater than 10 Angstroms and disposed on one of the top or bottom surface of the magnetic tunnel junction stack.

12. The magnetic random access memory device of claim 11, wherein the free magnetic layer includes at least one of iron (Fe) or cobalt (Co).

13. The magnetic random access memory device of claim 11, wherein the free magnetic layer includes a layer of CoFeB.

14. A magnetic random access memory device comprising:

a magnetic tunnel junction stack including:

a pinned magnetic layer;

a tunnel barrier layer formed of magnesium oxide (MgO);

a free magnetic layer adjacent to the tunnel barrier layer, wherein the free magnetic layer includes a plurality of elements wherein at least one element is vanadium; and a layer consisting of vanadium (V) directly adjacent to the free magnetic layer;

wherein the layer of vanadium (V) is of a predetermined thickness of greater than 10 Angstroms and disposed on one of the top or bottom surface of the magnetic tunnel junction stack.

15. The magnetic random access memory device of claim 14, wherein the free magnetic layer is formed on a seed layer comprising one of silver (Ag) or vanadium (V).

16. The magnetic random access memory device of claim 14, wherein an interface region between the free magnet layer and the tunnel barrier layer comprises an alloy formed of vanadium (V).

17. The magnetic random access memory device of claim 14, wherein the free magnetic layer is formed of a multilayer of iron (Fe), vanadium (V) and cobalt (Co).

18. The magnetic random access memory device of claim 17, wherein the free magnetic layer is formed of multilayer of x Fe|y V|z Fe] * n, wherein x and z are predetermined thicknesses ranging from approximately 5 to 15 angstroms and y is a predetermined thickness ranging from approximately 1 to 10 angstroms and n represents a predetermined number of layers.

19. The magnetic random access memory device of claim 17, wherein the free magnetic layer is formed of multilayer of

[x FeCo|y V|z FeCo] * n, wherein x and z are predetermined thicknesses ranging from approximately 5 to 15 angstroms and y is a predetermined thickness ranging from approximately 1 to 10 angstroms and n represents a predetermined number of layers.

20. The magnetic random access memory device of claim 14, wherein the free magnetic layer is formed of multilayers of iron (Fe), vanadium (V), cobalt (Co) and boron (B) or a combination of alloys thereof.

21. The magnetic random access memory device of claim 20 wherein the free magnetic layer is formed of multilayer of [x FeCoB|y V|z FeCoB] * n, wherein x and z are predetermined thicknesses ranging from approximately 5 to 15 angstroms and y is a predetermined thickness ranging from approximately 1 to 10 angstroms and n represents a predetermined number of layers.

* * * * *